United States Patent
Maturu et al.

(10) Patent No.: US 12,130,321 B2
(45) Date of Patent: Oct. 29, 2024

(54) FAULT DETECTION IN A POWER TRANSMISSION SYSTEM

(71) Applicant: Hitachi Energy Ltd, Zürich (CH)

(72) Inventors: Suresh Maturu, Andhra Pradesh (IN); Sachin Srivastava, Karnataka (IN); Arulselvan G, Coimbatore (IN); Od Naidu, Karnataka (IN)

(73) Assignee: HITACHI ENERGY LTD, Zurich (CH)

( * ) Notice: Subject to any disclaimer, the term of this patent is extended or adjusted under 35 U.S.C. 154(b) by 102 days.

(21) Appl. No.: 17/913,022

(22) PCT Filed: Feb. 16, 2021

(86) PCT No.: PCT/EP2021/053756
§ 371 (c)(1),
(2) Date: Sep. 20, 2022

(87) PCT Pub. No.: WO2021/209180
PCT Pub. Date: Oct. 21, 2021

(65) Prior Publication Data
US 2023/0142049 A1 May 11, 2023

(30) Foreign Application Priority Data
Apr. 16, 2020 (IN) .............................. 202041016504

(51) Int. Cl.
*G01R 31/08* (2020.01)
*G01R 25/00* (2006.01)
*H02H 1/00* (2006.01)
*H02H 7/22* (2006.01)

(52) U.S. Cl.
CPC ............ *G01R 31/086* (2013.01); *G01R 25/00* (2013.01); *H02H 1/0007* (2013.01); *H02H 7/22* (2013.01)

(58) Field of Classification Search
CPC ...... G01R 31/00; G01R 31/08; G01R 31/081; G01R 31/086; G01R 25/00; G01R 25/02;
(Continued)

(56) References Cited

U.S. PATENT DOCUMENTS

| | | | |
|---|---|---|---|
| 6,212,446 B1 * | 4/2001 | Sato ......................... | H02J 3/40 700/292 |
| 2003/0147186 A1 * | 8/2003 | Schultz ................... | H02P 9/107 361/15 |

(Continued)

FOREIGN PATENT DOCUMENTS

| JP | H06245383 A | 9/1994 |
|---|---|---|
| JP | 2009017681 A | 1/2009 |

(Continued)

OTHER PUBLICATIONS

International Search Report and Written Opinion of the International Searching Authority for the corresponding PCT Application No. PCT/EP2021/053756 dated May 7, 2021, 11 pages.

(Continued)

*Primary Examiner* — Hoai-An D. Nguyen
(74) *Attorney, Agent, or Firm* — Procopio, Cory, Hargreaves & Savitch LLP

(57) ABSTRACT

Fault detection during a power swing in a power transmission system is described. Voltage and current measurements are obtained for each phase at a terminal of the power transmission system. Based on measurements obtained, a value of change in an impedance angle for each phase-to-ground loop and each phase-to-phase loop for each sample of the voltage and current values is calculated, where the value of change in the impedance angle is a difference between impedance angles of two samples separated by a predetermined interval. The average values for change in impedance angle based on a predetermined number of values of change in the impedance angle for each phase-to-
(Continued)

ground loop and each phase-to-phase loop is calculated. The average values are compared with a threshold range of change in impedance angle. Based on the comparison, a fault in one or more of the phase-to-ground loops or phase-to-phase loops is detected and classified.

18 Claims, 13 Drawing Sheets

(58) Field of Classification Search
CPC .......... H02H 1/00; H02H 1/0007; H02H 1/04; H02H 3/00; H02H 3/02; H02H 3/05; H02H 3/38; H02H 3/382; H02H 3/40; H02H 7/00; H02H 7/22; Y04S 10/00; Y04S 10/50; Y04S 10/52
USPC .......................................... 324/500, 512, 521
See application file for complete search history.

(56) References Cited

U.S. PATENT DOCUMENTS

| 2006/0097728 | A1* | 5/2006 | Saha | .................... G01R 31/085 |
| | | | | 324/525 |
| 2011/0102952 | A1 | 5/2011 | Yelgin | |
| 2014/0121989 | A1* | 5/2014 | Kamath | .................. G16Z 99/00 |
| | | | | 702/19 |
| 2016/0084893 | A1 | 3/2016 | Gubba Ravikumar et al. | |
| 2018/0275199 | A1 | 9/2018 | Parkin | |
| 2021/0063463 | A1* | 3/2021 | George | ................ G01R 31/088 |

FOREIGN PATENT DOCUMENTS

| JP | 2011254626 A | 12/2011 |
| JP | 2017219463 A | 12/2017 |
| WO | 2009/155953 A1 | 12/2009 |
| WO | 2012/037947 A1 | 3/2012 |

OTHER PUBLICATIONS

Mechraoui et al..: "A new blocking principle with phase and earth fault detection during fast power swings for distance protection", IEEE transactions on power delivery, IEEE service center, NY, US, vol. 10, No. 3, Jul. 1995, pp. 1242-1248, ISSN: 0885-8977.
Ganeswara Rao et al., "Power-Swing detection using moving window averaging of current signals", IEEE Transactions on Power Delivery, vol. 30, No. 1, Feb. 2015, pp. 368-376.

* cited by examiner

500

502
OBTAINING VOLTAGE MEASUREMENTS AND CURRENT MEASUREMENTS FOR EACH PHASE AT A TERMINAL OF THE POWER TRANSMISSION SYSTEM, WHEREIN THE VOLTAGE MEASUREMENTS AND THE CURRENT MEASUREMENTS ARE OBTAINED WITH ONE OR MORE MEASUREMENT EQUIPMENT ASSOCIATED WITH THE TERMINAL OF THE POWER TRANSMISSION SYSTEM, WHEREIN THE VOLTAGE MEASUREMENTS AND THE CURRENT MEASUREMENTS COMPRISE SAMPLED VALUES OF VOLTAGE AND CURRENT OBTAINED AT THE TERMINAL

504
CALCULATING, FOR EACH SAMPLED VALUE OF THE VOLTAGE AND CURRENT, A VALUE OF CHANGE IN AN IMPEDANCE ANGLE FOR EACH PHASE-TO-GROUND LOOP AND EACH PHASE-TO-PHASE LOOP, WHEREIN THE VALUE OF CHANGE IN THE IMPEDANCE ANGLE IS A DIFFERENCE BETWEEN IMPEDANCE ANGLES OF TWO SAMPLES SEPARATED BY A PREDETERMINED INTERVAL

506
CALCULATING AVERAGE VALUES FOR CHANGE IN IMPEDANCE ANGLE FOR A PREDETERMINED NUMBER OF VALUES OF THE CHANGE IN THE IMPEDANCE ANGLE, FOR EACH PHASE-TO-GROUND LOOP AND EACH PHASE-TO-PHASE LOOP

508
COMPARING THE AVERAGE VALUES CALCULATED FOR EACH PHASE-TO-GROUND LOOP AND EACH PHASE-TO-PHASE LOOP WITH A THRESHOLD OF CHANGE IN IMPEDANCE ANGLE

510
DETECTING A FAULT IN ONE OR MORE OF THE PHASE-TO-GROUND LOOPS OR PHASE-TO-PHASE LOOPS BASED ON THE COMPARISON

Fig. 5

FAULT DETECTION IN A POWER TRANSMISSION SYSTEM

CROSS-REFERENCE TO RELATED APPLICATIONS

This application is a national stage entry of International Patent Application No. PCT/EP2021/053756, filed on Feb. 16, 2021, which claims priority to Indian Patent Application No. 202041016504, filed on Apr. 16, 2020, which are both hereby incorporated by reference in their entireties.

TECHNICAL FIELD

The present subject matter relates, in general, to fault detection in power transmission lines. In particular, the present subject matter relates to fault detection during a power swing in a power transmission system.

BACKGROUND

An electric power transmission system is a large and complex network that comprises transmission lines with numerous electrical components, such as generators, transformers, relays, etc. Power transmission systems are often subjected to system disturbances, such as due to transmission line faults, switching operations in heavily loaded transmission lines, changes in load magnitudes and direction etc. Generally, a fault may be defined as an abnormal condition of the electrical system causing disruption in the normal flow of electric current. This deviated flow of electric current causes changes in voltage and/or current flow, which interrupts power transmission. System disturbances that occur in transmission systems can cause power swings.

Power swing is a phenomenon in which rotor angles of groups of generators accelerate or decelerate relative to each other, which results in a variation in the three-phase power flow. Especially, inter-area swings may result in large fluctuations of power between two areas of a power system connected via tie lines.

Tripping of relays during the power swing phenomena is undesirable, and hence they are generally blocked during power swings. As a result, the faults that occur during a power swing in the blocking period may go undetected which can cause system blackouts.

BRIEF DESCRIPTION OF DRAWINGS

The features, aspects, and advantages of the present subject matter will be better understood with regard to the following description and accompanying figures. The use of the same reference number in different figures indicates similar or identical features and components.

FIG. 5 illustrates a method for fault detection during a power sing in a power transmission system, in accordance with an embodiment of the present subject matter.

SUMMARY

Figure 1A:
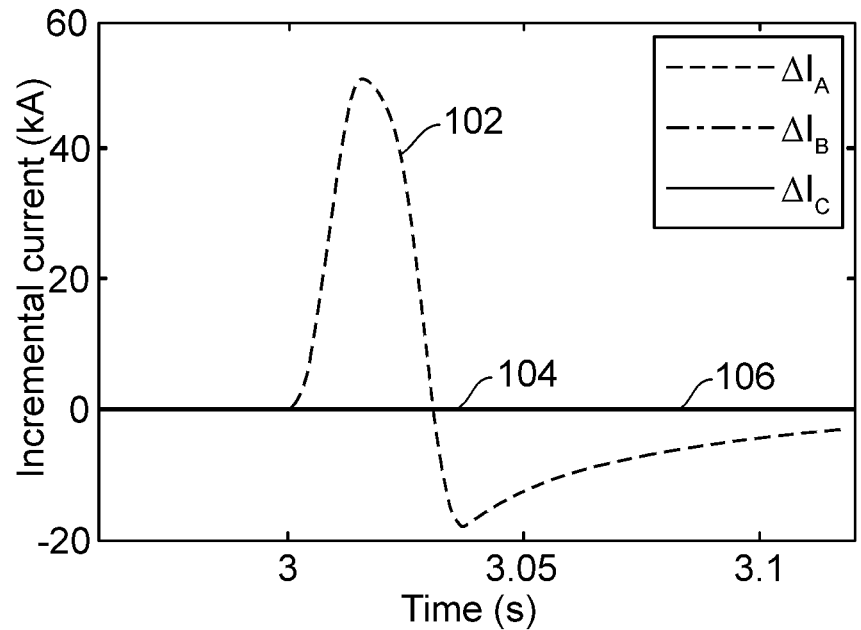
FIGS. 1(a), 1(b), 1(c) and 1(d) in a first example illustrate monitoring of incremental currents in a power transmission line for fault detection based on a method known in the art.

Embodiments of the present invention provide a method for fault detection during a power swing in a power transmission system, a device for fault detection, and a computer readable storage medium for fault detection.

According to a first aspect, a method for fault detection during power swing in a power transmission system is provided. The method comprises obtaining voltage measurements and current measurements for each phase at a terminal of the power transmission system. The voltage measurements and the current measurements are obtained with one or more measurement equipment associated with the terminal of the power transmission system. The voltage measurements and the current measurements comprise sampled values of voltage and current obtained at the terminal. Based on each sampled value of the voltage and current, a value of change in an impedance angle for each phase-to-ground loop and each phase-to-phase loop is calculated, where the value of change in the impedance angle is a difference between impedance angles of two samples separated by a predetermined interval. Further, average values for change in impedance angle for a predetermined number of values of the change in the impedance angle, for each phase-to-ground loop and each phase-to-phase loop is calculated. The average values calculated for each phase-to-ground loop and each phase-to-phase loop are compared with a threshold of change in the impedance angle and based on the comparison a fault is detected in one or more of the phase-to-ground loops or phase-to-phase loops. The threshold may be a range of 1 to 3 degrees. A fault in one or more of the phase-to-ground loops or phase-to-phase loops is detected when an average value of the change in impedance angle lies within the threshold range.

According to a second aspect an intelligent electronic device (IED) to detect a fault in a power transmission line is provided. The IED comprises a processor and a fault detection module executable by the processor. The fault detection module is configured to obtain voltage measurements and current measurements from each phase at a terminal of the power transmission system. The voltage measurements and the current measurements are obtained with one or more measurement equipment associated with the terminal of the power transmission system. The voltage measurements and the current measurements comprise sampled values of voltage and current obtained at the terminal. The fault detection module is configured to calculate a value of change in an impedance angle for each phase-to-ground loop and each phase-to-phase loop for each sampled value of the voltage and current. The change in the impedance angle is a difference between impedance angles of two samples and the two samples are separated by a predetermined interval. Further, the fault detection module is configured to calculate the average values for change in impedance angle for a predetermined number of values of the change in the impedance angles for each phase-to-ground loop and each phase-to-phase loop. The average values calculated for each phaseto-ground loop and each phase-to-phase loop is compared with a threshold of change in impedance angle. Based on the comparison, a fault in one or more of the phase-to-ground loops or phase-to-phase loops based is detected. The threshold may be in a range of 1-3 degrees. A fault in one or more of the phase-to-ground loops or phase-to-phase loops is detected when an average value of the change in impedance angle lies within the threshold range.

According to a third aspect a non-transitory computer readable medium containing program instructions which when executed cause an intelligent electronic device (IED) to detect a fault in a power transmission line. The program instructions comprise instructions to obtain voltage measurements and current measurements from each phase at a terminal of the power transmission system. The voltage measurements and the current measurements are obtained with one or more measurement equipment associated with the terminal of the power transmission system. The voltage measurements and the current measurements comprise sampled values of voltage and current obtained at the terminal. The program instructions also comprise instructions to calculate a value of change in an impedance angle for each phase-to-ground loop and each phase-to-phase loop for each sampled value of the voltage and current. The change in the impedance angle is a difference between impedance angles of two samples and the two samples are separated by a predetermined interval. Further, the program instructions comprise instructions to calculate the average values for change in impedance angle for a predetermined number of values of the change in the impedance angles for each phase-to-ground loop and each phase-to-phase loop. The average values calculated for each phase-to-ground loop and each phase-to-phase loop is compared with a threshold of change in impedance angle. The threshold may be in a range of 1 to 3 degrees. A fault in one or more of the phase-to-ground loops or phase-to-phase loops is detected when an average value of the change in impedance angle lies within the threshold range.

DETAILED DESCRIPTION

The present subject matter relates to fault detection in a power transmission line. The following describes fault detection in relation to power swings, especially detecting faults at or close to swing center voltages. The subject matter, however, is not restricted to fault detection in power swings.

Power swings are generally classified into stable power swings and unstable power swings. Stable power swings occur where the generators do not slip poles or lose synchronization, and the system reaches an acceptable state of operation. Whereas, an unstable power swing may result in slipping of poles between generators resulting in wild fluctuations in voltages, currents and power.

During a power swing period, the distance relay, in general, will be blocked from operation to prevent maloperations as the impedance locus may enter the region of operation of a distance measuring zone. If a fault occurs during the blocking period of the distance relay during a power swing, the fault will remain undetected. The non-detection of fault imposes a stress on the power system elements, such as transformers, generators etc. The stress on the power system elements in turn effects the power system stability. In order to avoid widespread disturbances, the distance relay should be allowed to operate only for short circuit faults during power swings and remain blocked during power swings when no fault occurs. This is termed as power swing unblocking. When faults that occur during power swings cannot be detected, they may lead to equipment or system failures and in worst cases blackouts.

In addition to fault detection, fault classification must also be performed to be able to identify type of faults. Typically, faults may be classified into four types of faults namely a line-to-ground fault A-g, a line-to-line fault AB, a double line-to-ground fault BC-g and a three-phase fault ABC-g, where A, B and C are the three phases of the power transmission lines.

In one technique, for the fault detection and classification during power swing, i.e., during the power swing unblocking period, delta currents are used. However, these delta or incremental currents are not available in all power system conditions like faults around swing center voltage, systems with high source impedances, inverter-based systems (renewables), during high impedance faults etc. Hence, during such power system conditions, fault detection and classification may not be reliably performed.

FIGS. 1(a), 1(b), 1(c) and 1(d) in a first example illustrate monitoring of incremental currents in a power transmission line for fault detection based on a method known in the art. In a first case a predefined threshold current is set to a value of 1 kA. The predefined threshold is set to detect a fault based on comparison of incremental current values with the set threshold value.

The example of FIGS. 1(a)-1(d) considers that a fault may have occurred on the transmission line at a distance of 20% of the protected line. The source to line impedance ratio (SIR) of two sources is considered to be 0.1:1, where the SIR is the ratio of the source impedance to the line impedance. The fault inception angle is 60 degrees. Further, the slip frequency is considered to be 0.5 Hertz and the time of fault inception is considered as 3 seconds. Based on these parameters, the incremental current based fault detection analysis is performed.

FIG. 1(a) depicts the incremental quantity of current analysis for fault detection and classification in a power transmission system. The current measured in phase A is represented by 102, the current measured in phase B is represented by 104 and the current measured in phase C is represented by 106. As it can be observed from the figure, the current measured in phase A 102 shows an incremental rise in its value, after 3 seconds of time. The currents measured in the phases B 104 and phase C 106 do not show any incremental rise in the current value at the same time. The incremental value in the current measurements is observed only in the phase A after the inception of the fault. The faulted phase is therefore identified by comparing the incremental value of current measured in phase A 102, with the predefined threshold value which was set to 1 kA. As the faulted phase is identified to be phase A, the fault is classified as a line-to-ground fault A-g.

Figure 1B:
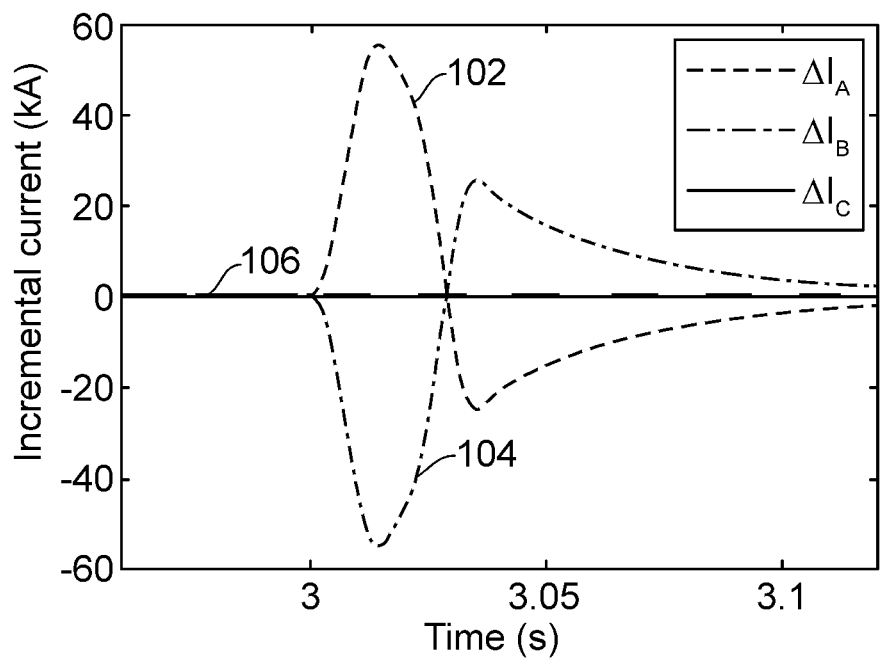

FIG. 1(b) depicts the incremental quantity of current analysis for fault detection and classification in a power transmission system, where it can be observed from the figure that the current measured in phase A 102 and the current measured in phase B 104 show incremental values after 3 seconds of time. The current measured in the phase C 106 does not show any incremental current value at the same time. The incremental value in the current measurements are observed only in phase A and phase B after the inception of the fault. The faulted phases are therefore identified by comparing the incremental value of current measured in phase A 102 and phase B 104, with the predefined threshold value which is set to 1 kA. As the faulted phases are identified to be phase A and phase B and based on the magnitudes of currents in these identified phases, the fault is classified as a line-to-line fault AB.

Figure 1C:
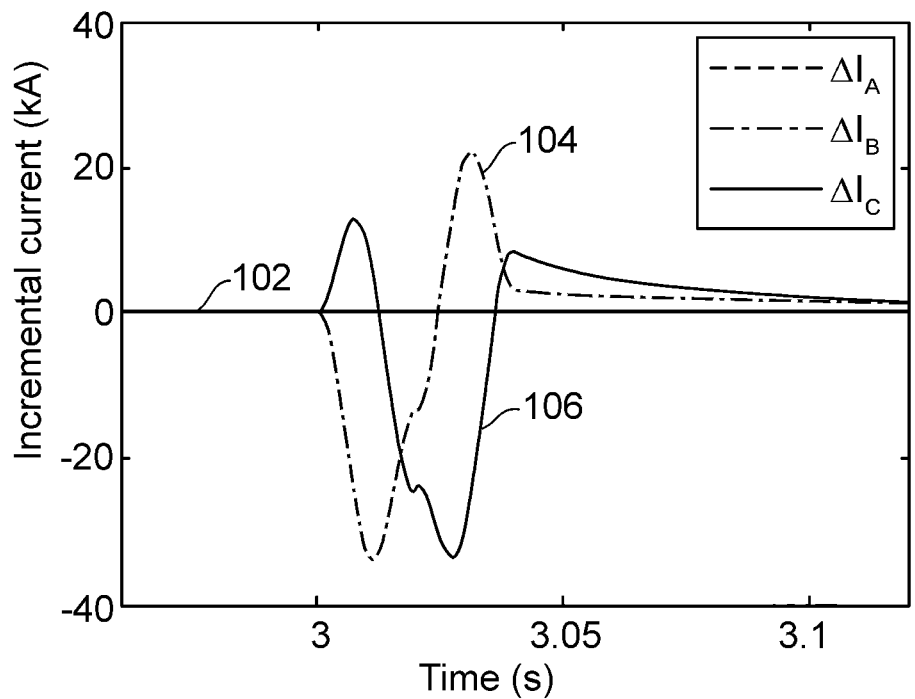

FIG. 1(c) depicts the incremental quantity of current analysis for fault detection and classification in a power transmission system, where it can be observed from the figure, the current measured in phase B 104 and the current measured in phase C 106 show incremental values after 3 seconds of time. The current measured in the phase A 102 does not show any incremental current value at the same time when the currents in phase B and phase C show incremental changes. The incremental current measurements are observed only in phase B and phase C of the transmission line, after the inception of the fault. The faulted phases are therefore identified by comparing the incremental values of current measured in phase B 104 and phase C 106, with the predefined threshold value which is set to 1 kA. As the faulted phases are identified to be phase B and phase C and based on the magnitudes of currents in the identified phases, the fault is classified as a double line-to-ground fault BC-g.

Figure 1D:
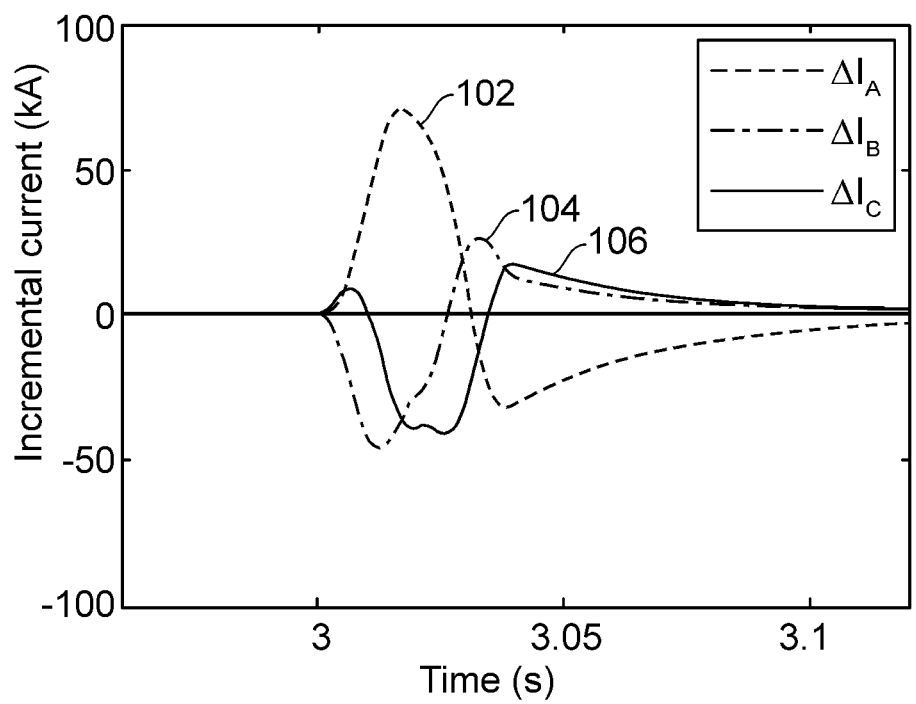

FIG. 1(d) depicts the incremental quantity of current analysis for fault detection and classification in a power transmission system, where it can be observed from the figure, the current measured in phase A 102, the current measured in phase B 104 and the current measured in phase C 106 show an incremental value after 3 seconds of time. The incremental current measurements are observed in all the three phases, such as phase A 102, phase B 104 and phase C 106 of the transmission line, after the inception of the fault. The faulted phases are therefore identified by comparing the incremental values of current measured in phase A 102, phase B 104 and phase C 106, with the predefined threshold value which is set to 1 kA. As the faulted phases are identified to be phase A, B and C and based on the magnitudes of currents in the identified phases, the fault is classified as a three phase-to-ground fault ABC-g.

FIGS. 2(a), 2(b), 2(c) and 2(d) in a second example illustrate monitoring of incremental currents in a power transmission line for fault detection based on a method known in the art. In the second example, a predefined threshold current is set to a value of 1 kA for fault detection and classification, similar to the first example. The predefined threshold is set to compare with the incremental current values that are observed on occurrence of a fault.

In the example shown in FIGS. 2(a)-2(d), faults are simulated at a distance of 80% of the protected line during a swing of 5 Hz at the swing center voltage. The fault in this case has been simulated at the swing center voltage with a high slip frequency of 5 Hz, for monitoring fault detection and classification based on incremental currents at adverse conditions. The source to line impedance ratio (SIR) for two sources, in the second case is considered to be 5:2 with a fault resistance of 10 ohms. Further, the time of fault inception is set to 1.3 seconds. Based on these parameters, the incremental current based fault detection analysis is performed.

Figure 2A:
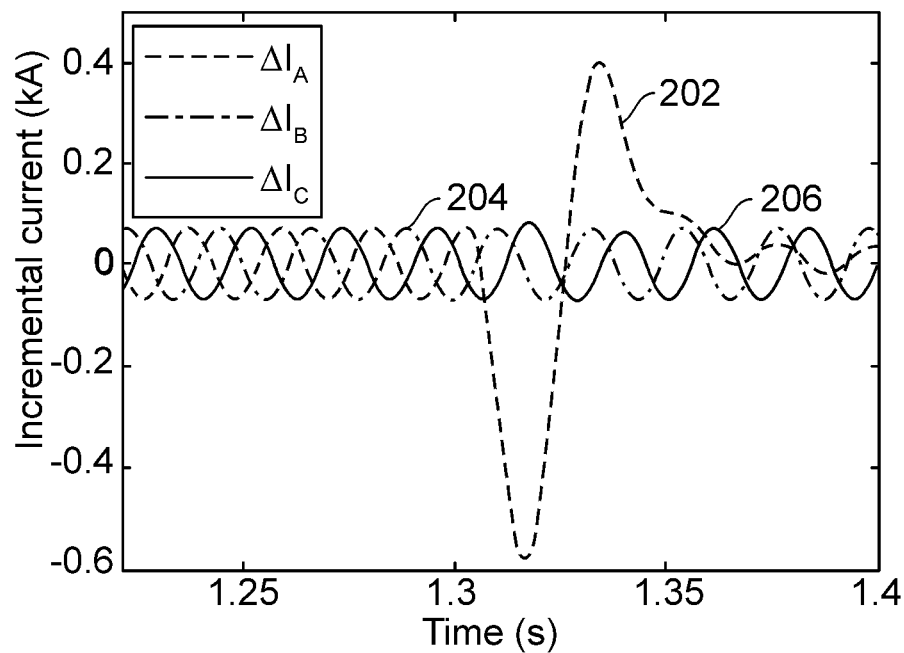
FIGS. 2(a), 2(b), 2(c) and 2(d) in a second example illustrate monitoring of incremental currents in a power transmission line for fault detection based on a method known in the art.

FIG. 2(a) depicts the incremental quantity of current analysis for fault detection and classification in a power transmission system. The current measured in phase A is represented by the waveform 202, the current measured in phase B is represented by waveform 204 and the current measured in phase C is represented by the waveform 206. As it can be observed from the figure, the current measured in phase A 202 shows an incremental value after 1.3 seconds of time. The currents measured in the phases B 204 and phase C 206 did not show any incremental current value at the same time when the current measured at A showed incremental changes. The incremental current measurements were observed only in the phase A after the inception of the fault. To identify the faulted phase, the incremental value of current measured in phase A 102 was compared with the predefined threshold value which was set to 1 kA. However, as the incremental current was less than the threshold, the fault was not detected and could not be classified.

Figure 2B:
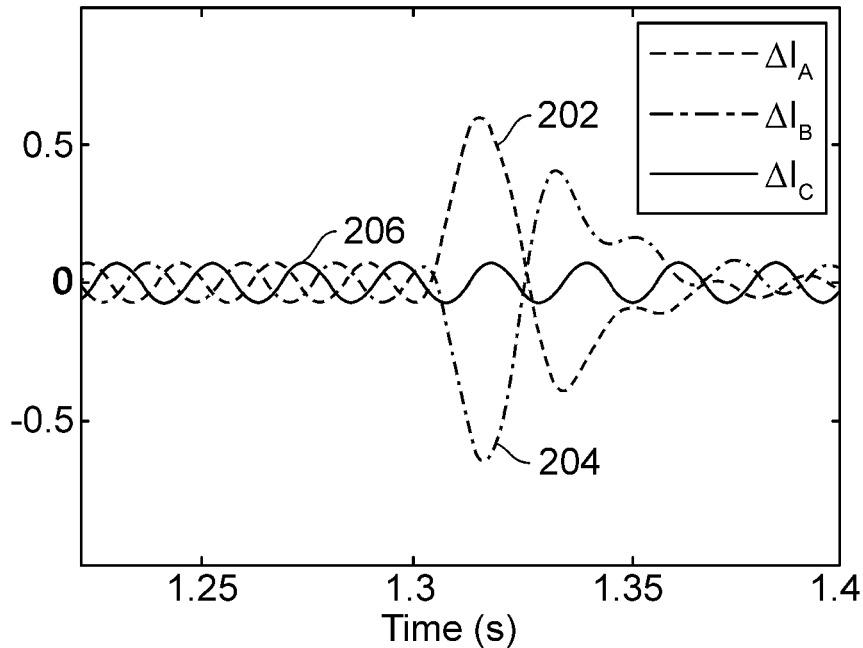

FIG. 2(b) depicts the incremental quantity of current analysis for fault detection and classification in a power transmission system, where it can be observed from the figure, the current measured in phase A 202 and the current measured in phase B 204 show an incremental value after 1.3 seconds of time. The current measured in phase C 206 did not show any incremental current value at the same time when the currents measured at phase A and phase B showed incremental changes. The incremental current measurements were observed only in phase A and phase B after the inception of the fault. To identify the faulted phase, the incremental values of current measured in phase A 202 and phase B 204 were compared with the predefined threshold value which was set to 1 kA. However, as the incremental rise in the current was less than the threshold, the fault was not detected and could not be classified.

Figure 2C:
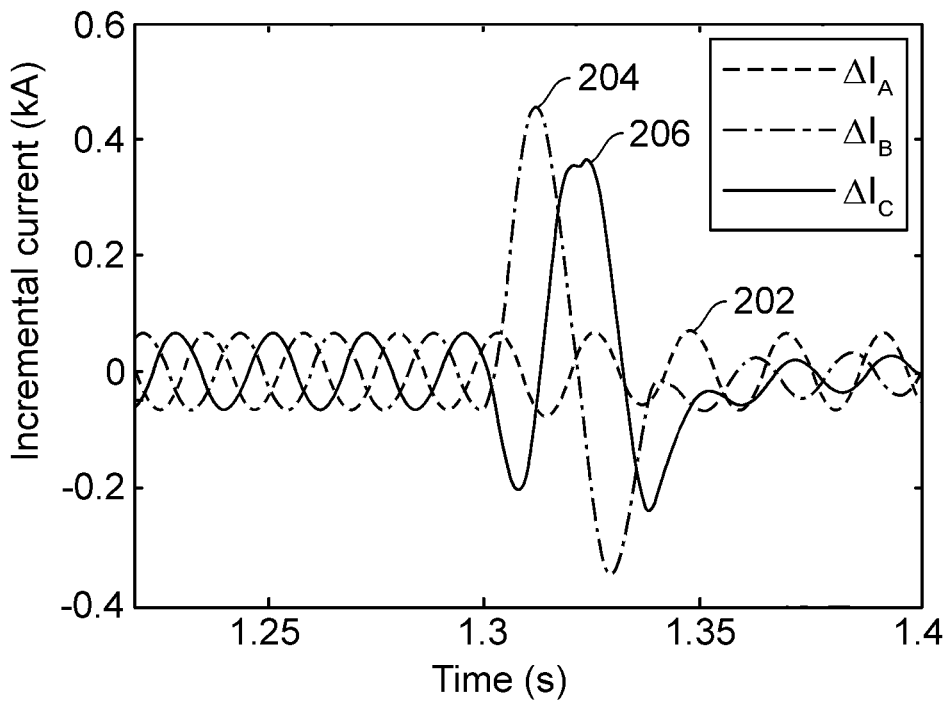

FIG. 2(c) depicts the incremental quantity of current analysis for fault detection and classification in a power transmission system, where as it can be observed from the figure, the current measured in phase B 204 and the current measured in phase C 206 show an incremental rise in their values after 1.3 seconds of time. The current measured in phase A 202 does not show any incremental current value at the same time as when the currents measured at phase B and phase C show incremental changes. The incremental current measurements were observed only in phase B and phase C of the transmission line after the inception of the fault. To identify the faulted phase, the incremental values of current measured in phase B 204 and phase C 206 were compared with the predefined threshold value which was set to 1 kA. However, as the incremental currents were less than the threshold, the fault was not detected and could not be classified.

Figure 2D:
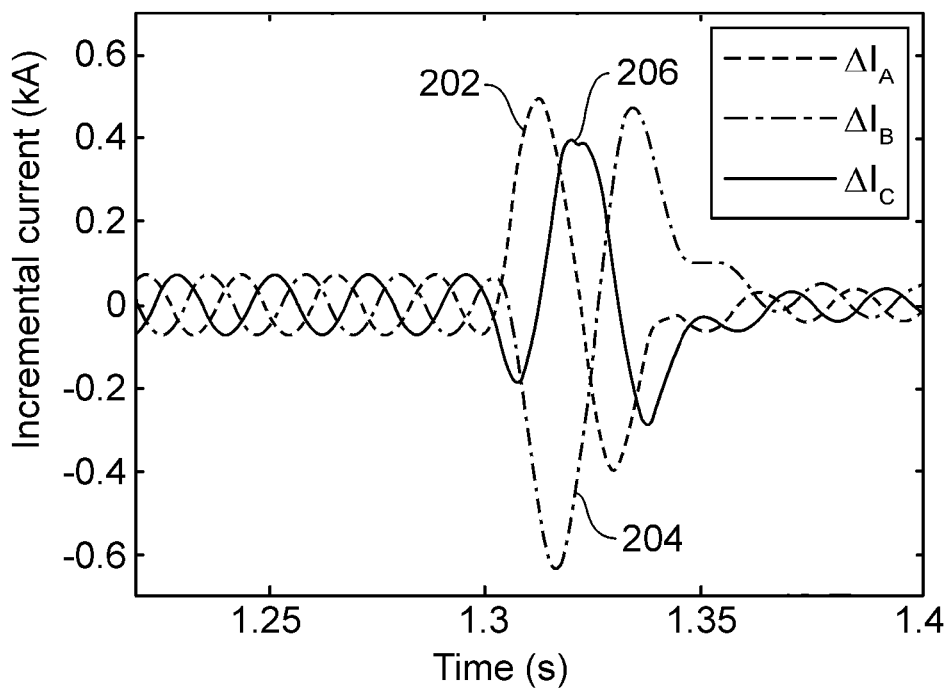

FIG. 2(d) depicts the incremental quantity of current analysis for fault detection and classification in a power transmission system, as it can be observed from the figure, the current measured in phase A 202, the current measured in phase B 204 and the current measured in phase C 206 show incremental values after 1.3 seconds of time. The incremental current measurements were observed in all the three phases phase A 202, phase B 204 and phase C 206 of the transmission line after the inception of the fault. To identify the faulted phase, the incremental values of current measured in phase A 202, phase B 204 and phase C 206 were compared with the predefined threshold value which was set to 1 kA. However, as the incremental rise in the current was less than the threshold, the fault was not detected and could not be classified.

From the first and second example discussed above with reference to FIGS. 1(a)-1(d) and 2(a)-2(d), it can be seen that the incremental rise in current is not above the threshold for cases described in FIGS. 2(a)-2(d). The incremental quantity is dependent on various factors, such as SIR of the system, location of the fault, fault inception angle and fault impedance. Considering the specific example of the line-to-ground, A-g fault from the two examples discussed above, it is observed that the maximum incremental quantity of current measured in the first example is 50 kA, which is greater than the threshold of 1 kA, and the maximum incremental quantity of current measured in the second example is 0.5 kA, which is less than the threshold of 1 kA.

Thus, the occurrence of the fault in the first example can be detected whereas the occurrence of the fault in the second example may not be detected.

Therefore, the identification of faulted phase using comparison of incremental quantities of current measured in any phase of the transmission line with the predefined threshold value is not reliable in all conditions. Further, the threshold depends on parameters, such as fault inception, location of the fault and fault resistance; and fault at swing crest or center of the voltage. Therefore, there is a need to develop a current threshold-free fault detection and classification method for faults during power swing.

The present subject matter provides for accurate single ended fault detection and classification using local measurements on the protected line, particularly during a power swing in a power transmission system. The fault detection and classification are based on a change in the impedance angle, also referred to as delta impedance angle. An example method comprises measuring three phase voltages and currents to obtain voltage and current measurements at one terminal or at one end of the transmission line. The measurements of voltages and currents are obtained from the measurement equipment as a voltage signal or a current signal respectively. The signals are sampled according to a configured sampling frequency to obtain sampled values of voltage and currents. The sampled values can be obtained for every instant in a measurement cycle. For example, a measurement cycle can be of 20 milliseconds (50 Hz frequency) and samples can be available at each millisecond at 1 kHz sampling frequency. The magnitudes and angles of the voltages and currents are computed from the sampled values. For each of the sampled values obtained, a change in an impedance angle for each phase-to-ground loop and each phase-to-phase loop is computed with reference to another sample separated by a predetermined interval from the sample under consideration. Further, an average value is calculated for a predetermined number of values of the change in the impedance angles, for each phase-to-ground loop and each phase-to-phase loop. The calculated average values are compared with a threshold and, based on the comparison, the fault is detected and classified in the corresponding loop. For example, the threshold may be a threshold range and the fault may be detected when the average value lies in the threshold range, and the fault may be classified based on the loop in which the fault is detected.

The above and other features, aspects, and advantages of the subject matter will be better explained with regard to the following description and accompanying figures. Wherever possible, the same reference numbers are used in the drawings and the following description to refer to the same or similar parts. While several examples are described, modifications, adaptations, and other implementations are possible.

Figure 3:
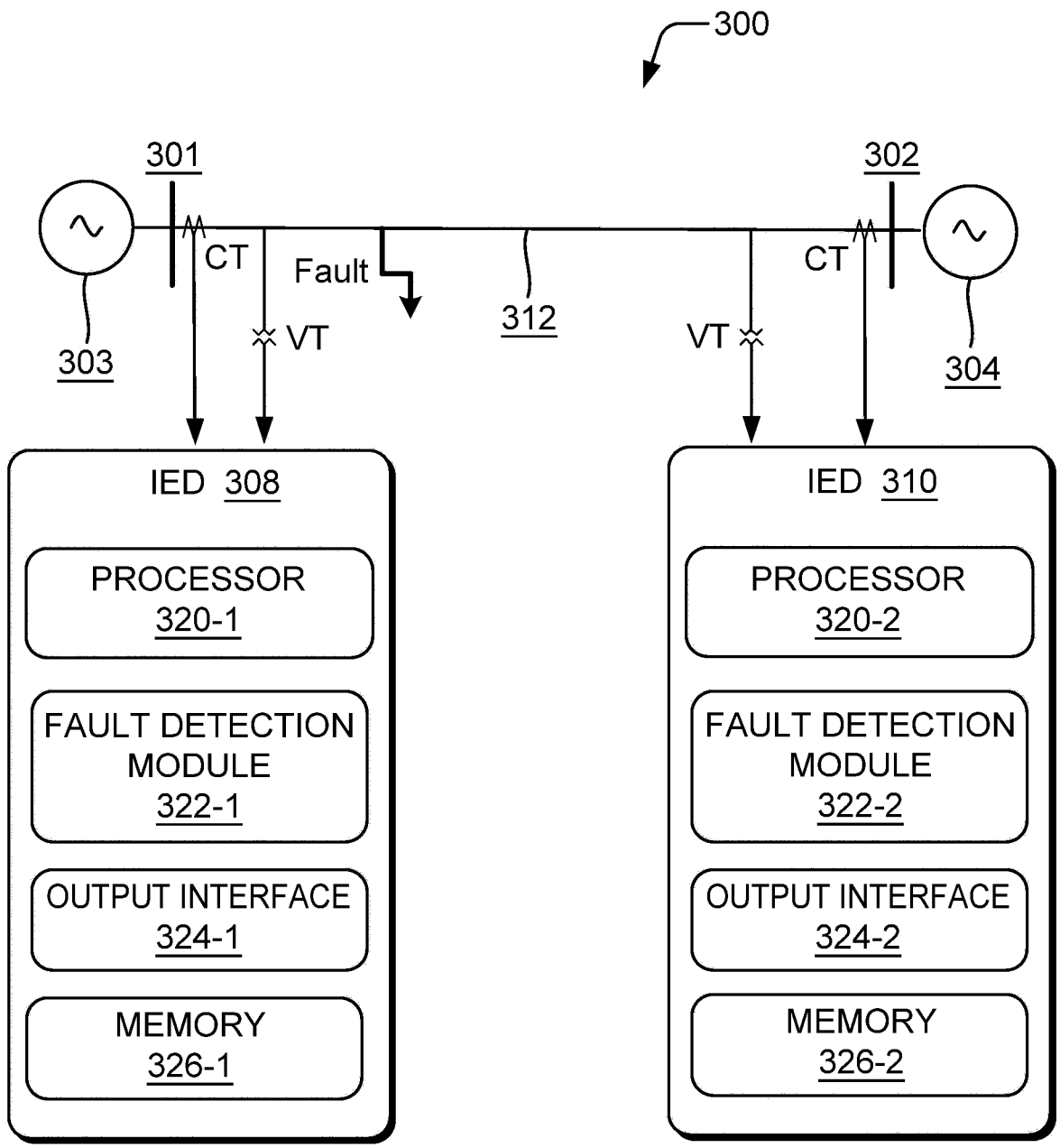
FIG. 3 illustrates a block diagram of a two-source equivalent electrical network, in accordance with an embodiment of the present subject matter.

FIG. 3 illustrates a block diagram of a two-source equivalent electrical network, in accordance with an embodiment of the present subject matter. The two-source equivalent electrical network 300 comprises a power transmission line 312 connected between two terminals Bus M 301 and Bus N 302. The two-electrical sources, namely sources 303 and 304 supply power to Bus M 301 and Bus N 302 respectively. In one example, the sources 303 and 304 may be power generators, such as synchronous power generators. The electrical network 300 may transmit electric power at high voltages, such as in the range of kilovolts, and for long distances, such as for tens or hundreds of kilometres.

The techniques of the present subject matter may be implemented with one or more devices associated with the power transmission line. The devices may include current transformers, voltage transformers, circuit breakers, and Intelligent Electronic Devices (IEDs). As shown in FIG. 3, an IED A 308 is associated with Bus M 301, also referred to as first terminal, and an IED B 310 is associated with Bus N 302, also referred to as second terminal. The voltage transformer at each terminal is depicted as VT and the current transformer at each terminal is depicted as CT. The IEDs may be configured to detect a power swing in a power transmission line using techniques known in the art and subsequently detect a fault during the power swing.

In an example, the steps of the method of the present subject matter may be performed by one or more modules. The modules may be implemented as instructions executable by one or more processors. In some examples, the methods may be performed by the IEDs, while in other examples, the methods may be performed by a server that receives the voltage and current measurements from the IEDs. For instance, in the example where the IEDs, such as the IEDs 308 and 310 perform the method, the modules are executed by the processors of the IEDs 308 and 310. In other examples, where a server performs the method, the modules may be executed by the processor of the server. In case the method is implemented in part by an IED, and in part by the server, the modules (depending on the step) will be distributed accordingly in the IED and the server.

In one example, the IED A 308 and IED B 310 may have similar components as shown in FIG. 3 and may be configured to receive input measurement signals from various measurement equipment connected to the transmission line 312, such as current transformers, potential transformers, Rogowski coils or other measurement sensors. The IEDs 308 and 310 may process the measurements obtained with the help of a processor 320-1 and 320-2 respectively. The processors 320-1 and 320-2 may be individually referred to as processor 320. The processor 320 may be implemented as a dedicated processor, a shared processor, or a plurality of individual processors, some of which may be shared. The IEDs 308 and 310 may each comprise a memory 326-1 and 326-2 respectively, that may be communicatively connected to the respective processor 320. The memory 326-1 and 326-2 may be individually referred to as memory 326. Among other capabilities, the processor 320 may fetch and execute computer-readable instructions, stored in the memory 326. In one example, the memory 326-1 and 326-2 may store a fault detection module 322-1 and 322-2 respectively. The fault detection modules 322-1 and 322-2 may be individually referred to as fault detection module 322. In other examples, the fault detection module 322 may be external to the memory 326. The memory 326 may include any non-transitory computer-readable medium including, for example, volatile memory, such as RAM, or non-volatile memory, such as EPROM, flash memory, and the like.

In one example, on detecting a power swing in the transmission line, a method to detect a fault that may occur during the power swing may be performed by the IED. For discussion, the method for fault detection is described with reference to the IED 308 implemented at terminal M 301. However, a similar method will be executed by the IED 310 at terminal N as may be understood. To detect the fault, the processor 320 of the IED 308 may fetch instructions to execute a fault detection module 322 to compute the voltage and current phasors from the measured voltages and currents at the terminal M 301. In one example, the voltage and current phasors may be computed from an average of sampled values of the measured voltages and currents. The voltage and current phasors computed may be used to calculate the impedance angles. A change in the impedance angles may be computed for a number of samples to calculate an average value of the change in the impedance angles. Based on the average value of the change in the impedance angles, a fault may be detected in the transmission line 312. In one example, on detecting the fault, the fault detection module 322 may enable line protection functions for the corresponding loop. In one example, the fault detection module 322 may enable the distance protection function for the corresponding loop which is typically blocked during power swing. For example, the IED 308 may be configured to release a phase in which a fault on the transmission line may be detected for distance protection. The distance protection function may be performed using techniques known in the art.

Further, IED 308 and 310 may comprise an output interface 324-1 and 324-2 respectively to communicate the results obtained from the fault detection module 322, for example, to a server. The output interfaces 324-1 and 324-2 may be individually referred to as output interface 324. In one example, when the method is implemented at a server, the IED 308 may communicate the current and voltage measurements to the server through the output interface 324. The output interface 324 may include a variety of computer-readable instructions-based interfaces and hardware interfaces that allow interaction with other communication, storage, and computing devices, such as network entities, web servers, databases, and external repositories, and peripheral devices. In one example, the fault detection parameters, current and voltage measurements, and the like may be viewed on a display connected to the output interface 324 or integrated with the IEDs 308 and 310.

Figure 4:
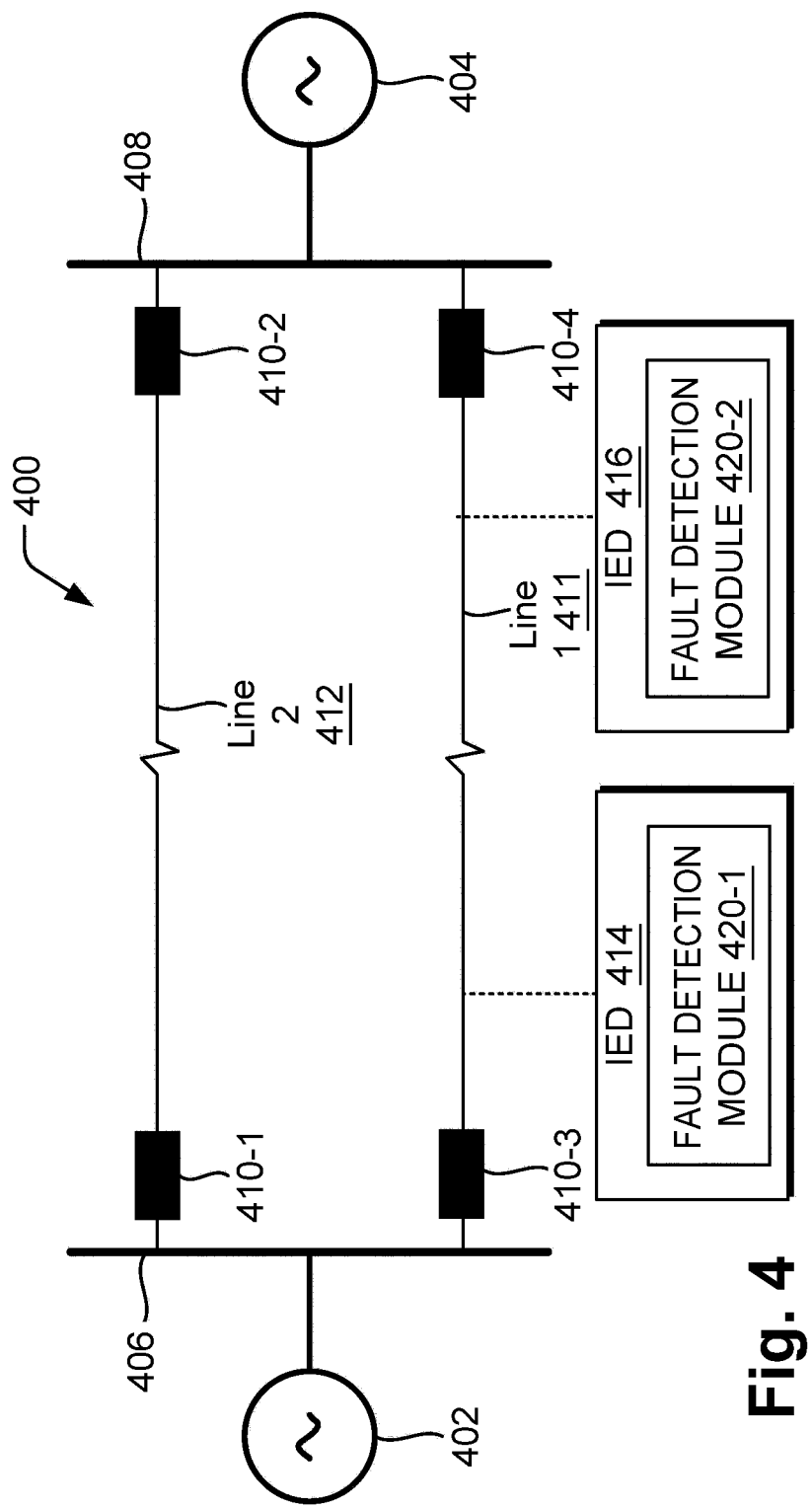
FIG. 4 illustrates a two-terminal system with a device for fault detection during a power swing, in accordance with an embodiment of the present subject matter.

FIG. 4 illustrates a two-terminal system with a device for fault detection in a power swing, in accordance with an example embodiment of the present subject matter. The two-terminal test system 400 may comprise two sources $E_{SM}$ 402 and $E_{SN}$ 404. In one example, the two sources $E_{SM}$ 402 and $E_{SN}$ 404 may be synchronous power generators connected to two buses M 406 and N 408 respectively. The bus M 406 is alternatively referred to as a first terminal M 406 and the bus N 408 is alternatively referred to as a second terminal N. In one example, there may be two transmission lines Line 1 411 and Line 2 412 collectively referred to as transmission lines or transmission line that may be connected across the two terminals M 406 and N 408.

It will be understood that the two-terminal test system 400 for fault detection may include a plurality of additional components or devices for monitoring, sensing, and controlling various parameters that may be associated with the transmission lines but are not shown for brevity. For example, components such as circuit breakers, sensors, current transformers, voltage transformers, loads connected to the transmission lines, shunt reactors, intelligent electronic devices IEDs, protective relays and the like may be connected to the transmission line.

In one example shown in FIG. 4, the two-terminal test system 400 comprises a pair of circuit breakers CB1 410-1 and CB3 410-3 connected to terminal M on Line 2 and Line 1 respectively. Similarly, circuit breakers CB2 410-2 and CB4 410-4 are connected to terminal N on Line 2 and Line 1 respectively. Circuit breakers CB are electrical switches that are either meant to make or break the current flow in transmission lines. They are typically configured to operate automatically based on signals from IEDs or other protection devices or manually. Circuit breakers are used for protecting the high voltage transmission lines from current overload conditions which may occur during a fault. They break the flow of current where the fault occurs which protects the transmission line and the components connected to the transmission line from further damage and on clearing the fault, the circuit breaker may be configured to restore normal operation.

An IED 414 and an IED 416 are provided at terminals M and N of the transmission line 411 respectively. The IED 414 and the IED 416 may be similar to the IEDs 308 and 310 discussed above. It will be understood that the transmission line 412 may also be connected to an IED at each terminal. In one example, the IED 414 and the IED 416 may comprise a fault detection module 420-1 and 420-2 respectively. The fault detection modules 420-1 and 420-2 may be individually referred to as fault detection module 420. For ease of discussion, the following description is provided using IED 414 as an example. However, it will be understood that IED 416 will also operate in a similar manner.

On detection of a power swing by the IED 414, the fault detection module 420 may be triggered by the IED 414. The fault detection module 420 obtains voltage measurements and current measurements for each phase at the corresponding terminal of the power transmission system. The voltage and current measurements may be obtained with one or more measurement equipment, such as current and voltage transformers, associated with the terminal of the power transmission system as explained above. The voltage measurements and the current measurements comprise sampled values of voltage and current obtained at the terminal.

The fault detection module 420 pre-processes the three phase voltage signals and the three phase current signals that are measured. The pre-processing of the measured voltage and current signals comprises computing the phase-to-ground and phase-to-phase voltage and currents magnitudes along with their phase angles for each phase or measurement loop, also referred to as voltage phasors and current phasors. The voltage phasors and current phasors may be computed for each phase-to-ground loop and each phase-to-phase loop respectively based on a full cycle Discrete Fourier Transform of the voltage measurements and the current measurements. The voltage and current measurements include sampled values of voltage and current obtained from the voltage and current phasors and are stored in the memory of the IED A 414. The number of samples N depends on the sampling frequency or sampling interval. For example, if a 50 Hz signal is sampled at a rate of 1 kHz, there may be 20 samples per one fundamental power cycle. These sampled values of voltage and current are stored in a buffer in the memory and are used for fault detection when a power swing is detected by the IED A 414.

During a power swing, there can be a continuous variation in the three-phase power flow. As an example, this can be due to the relative advancing or retarding of the rotor angles of the generators connected in the two-terminal system 400. Such variation can be due to a fault or it may be a typical power swing variation. On detection of a power swing, the method to detect a fault may be triggered by the IED 414 and performed by the fault detection module 420.

The fault detection module 420 calculates a value of change in an impedance angle for each phase-to-ground loop and each phase-to-phase loop, wherein the value of change in the impedance angle is a difference between impedance angles of two samples separated by the predetermined interval.

Equation 1 provides the calculation of a value of change in impedance angle for phase-to-ground loops and phase-to-phase loops, alternatively referred to as delta impedance angle:

$$d\Theta_{Lx}(k)=\Theta_{Lx}(k)-\Theta_{Lx}(k-N) \qquad (1)$$

where, $\ominus_{Lx}$ is the impedance angle for loop x, $d\ominus_{Lx}$ is the change in impedance angle for the $k^{th}$ sample for loop x, $\ominus_{Lx}(k)$ is the impedance angle calculated for a $k^{th}$ sample for loop x, N is the number of samples per measurement cycle, where one measurement cycle comprises a predetermined number of samples based on a sampling frequency, and x represents the phase-to-ground or phase-to-phase loops.

Here, x may take the values 1, 2, 3, 12, 23, and 31. In one example, when x is equal to 1, the value of change in the impedance angle for phase-to-ground loop of phase A is calculated. When x is equal to 2, the value of change in the impedance angle for phase-to-ground loop of phase B is calculated. When x is equal to 3, the value of change in the impedance angle for the phase-to-ground loop of phase C is calculated. Similarly, when x is equal to 12, the value of change in the impedance angle for the phase-to-phase loop of phases AB is calculated. When x is equal to 23, the value of change in the impedance angle for the phase-to-phase loop of phases BC is calculated and when x is equal to 31, the value of change in the impedance angle for the phase-to-phase loop of phases CA is calculated.

As discussed, for each sampled value of the voltage and current, a value of change in an impedance angle for each phase-to-ground loop and each phase-to-phase loop may be calculated. The value of change in the impedance angle is a difference between impedance angles of two samples separated by a predetermined interval. In one example, the value of change the impedance angle may be calculated for phase A, for a $21^{st}$ sample being the current sample and where the total number of samples N=20. The value of change in the impedance angle may be calculated using the equation 1, where, substituting the values of N and k in equation 1, we get, (1)

$$d\ominus_{Lx}(21) = \ominus_{Lx}(21) - \ominus_{Lx} \quad (1)$$

therefore, the value of the change in the impedance of the $21^{st}$ sample, will be the difference between the impedance angle obtained for the $21^{st}$ sample and the impedance angle obtained for the first sample. Once the value of the change in the impedance angle is computed, average values for change in impedance angle for a predetermined number of values of the change in the impedance angles, for each phase-to-ground loop and each phase-to-phase loop is computed.

The average values may be calculated taking some predetermined number of values for the change in the impedance angles. For example, five values of change in impedance angle, such as values for $d\ominus_{Lx}$ (21), $d\ominus_{Lx}$ (22), $d\ominus_{Lx}$ (23), $d\ominus_{Lx}$ (24) and $d\ominus_{Lx}$ (25), can be averaged. In one embodiment, the average values are calculated by applying a moving window average filter to calculate values of the change in impedance angle for the samples, wherein the predetermined number of values of the change in impedance angle is a size of the moving window. The size of the moving window may be equal to a number of samples in one measurement cycle in one example. The moving average of the value of change in the impedance angle may be calculated as shown in equation 2:

$$D\theta_{Lx} = \frac{1}{N} \sum_{q=k-N+1}^{k} d\theta_{Lx}(q) \quad (2)$$

where, $D\ominus_{Lx}$ is the average value for the change in the impedance angles, $d\ominus_{Lx}(q)$ is the value of change in the impedance angle at CO sample, q takes the value of k-N+1 where k is the present sample, and N is the total number of samples per cycle. It will be understood that in other examples, different values of N may be used. Using average values, and moving average values in particular, helps to smoothen out variations in the computed values of change in impedance angles.

The average value of the change in the impedance angles that is calculated for each phase-to-ground loop and each phase-to-phase loop is compared with a threshold of change in the impedance angle. The threshold can be set by a user, for example an expert. In one example, the threshold is a range, where the range is 1 to 3 degrees. The average value of the change in the impedance angles is compared with the threshold range. Accordingly, it may be determined whether the moving average value lies between the range or not. In one example, the fault is detected in one or more of the phase-to-ground loops or phase-to-phase loop when an average value of the change in impedance angle lies within the threshold range of change in impedance angle. The fault may further be classified as a phase-to-ground fault or a phase-to-phase fault depending on the loop for which the moving average value of change in impedance angle is within the range. When the value of the moving average value of change in impedance angle does not lie within the threshold range, no fault is detected.

The average values computed at each step, i.e., for each sample, is iteratively compared with the threshold range until a fault is detected or till all the average values corresponding to samples obtained during the power swing duration have been compared.

Further, on detection of the fault, the distance protection function of IED 414 may be triggered, which is typically blocked during a power swing. The distance protection function releases the corresponding distance measuring loop on detecting the fault in one or more of the phase-to-ground loops or phase-to-phase loops to determine the distance between the terminal M 406 and the point of inception of the fault.

The present subject matter hence provides an efficient fault detection technique based on the value of change in the impedance angle, so that a fault may be detected, especially during power swings. During a power swing, the impedance angle changes linearly, while in case of a fault, there is no substantial change (almost constant) in impedance angle especially when the fault is close to swing center voltages. Therefore, to detect these faults, the values of change in impedance angles is utilized. Further, the two-terminal system 400 not only detects faults in power swing, but also detects a fault that may occur at or about swing center voltages, making the two-terminal system 400 highly efficient. Such swing center voltages are the voltages of a two-source equivalent system, when that value of voltage is zero or close to zero, e.g. when the rotor angles of the two systems are 180 degrees apart.

FIG. 5 illustrates a method for fault detection during a power swing in a power transmission line, in accordance with an embodiment of the present subject matter. The order in which a method 500 is described is not intended to be construed as a limitation, and some of the described method blocks may be performed in a different order to implement the method 500 or an alternative method. Furthermore, the method 500 may be implemented in any suitable hardware, computer readable instructions, firmware, or combination thereof. For discussion, the method 500 is described with reference to the implementations illustrated in FIG. 3-4.

In the method 500, at block 502, voltage and current measurements for each phase at a terminal of the power transmission system is obtained. The voltage and current measurements are obtained with one or more measurement equipment associated with the terminal of the power transmission system. The voltage measurements and the current measurements comprise samples of voltage and current values obtained at the terminal. In one example, the voltage measurement for each phase at the terminal of the power transmission system may be obtained by a voltage transformer or a potential transformer and the current measurement for each phase at the terminal of the power transmission system may be obtained by a current transformer. In one example, the current transformers and voltage transformers may be operationally connected to an intelligent electronic device IED at terminal M and at terminal N. In the example of FIG. 4, the terminal M is shown by 406 and the terminal N by 408. The three-phase voltage and current measurements measured at terminals M and N of the transmission line may be fed to IED A 414 and IED B 416 respectively. From the current and voltage measurements monitored on Line 1 411, voltage and current phasors are computed. In one example, the voltage and current phasors are computed using full cycle Discreet Fourier Transform (DFT).

At block 504, for each sampled value of the voltage and current, a value of change in an impedance angle for each phase-to-ground loop and each phase-to-phase loop is calculated. The value of change in the impedance angle is a difference between impedance angles of two samples separated by a predetermined interval. The predetermined interval between the two samples for determining the value of change in impedance angle is a duration of one measurement cycle, where one measurement cycle comprises a predetermined number of samples based on a sampling frequency.

At block 506, average values for change in impedance angle for a predetermined number of values of the change in the impedance angle is calculated for each phase-to-ground loop and each phase-to-phase loop. The predetermined number of values may take any positive integer value from one. In one example the predetermined number of values for calculating an average value of the change in the impedance angle may be 5. The average values may be calculated by applying a moving window average filter to calculate values of the change in impedance angle for the samples, where the predetermined number of values of the change in impedance angle is a size of the moving window.

At block 508, the average values of the change in the impedance angle calculated for each phase-to-ground loop and each phase-to-phase loop is compared with a threshold of change in impedance angle. In one example, the threshold is in a range of 1 to 3 degrees. When it is determined that the moving average is within the threshold range, the occurrence of the fault is detected.

At block 510, based on the comparison at block 508, the fault is detected and further classified as a fault in one or more of the phase-to-ground loops or phase-to-phase loops. In one example, the fault detected in one or more of the phase-to-ground loops or phase-to-phase loops based on the comparison may be at a swing center voltage. When the value of the moving average lies within the threshold range, the fault is detected and classified as a phase-to-ground fault, a phase-to-phase fault or double phase-to-ground fault. On detecting the occurrence of the fault, the IED is configured to release the corresponding loop for distance protection on detecting the fault in one or more of the phase-to-ground loops or phase-to-phase loops for measuring a distance to fault from the terminal of the power transmission system, where the distance is the distance between the terminal M or N to point of the inception of the fault.

Figure 6A:
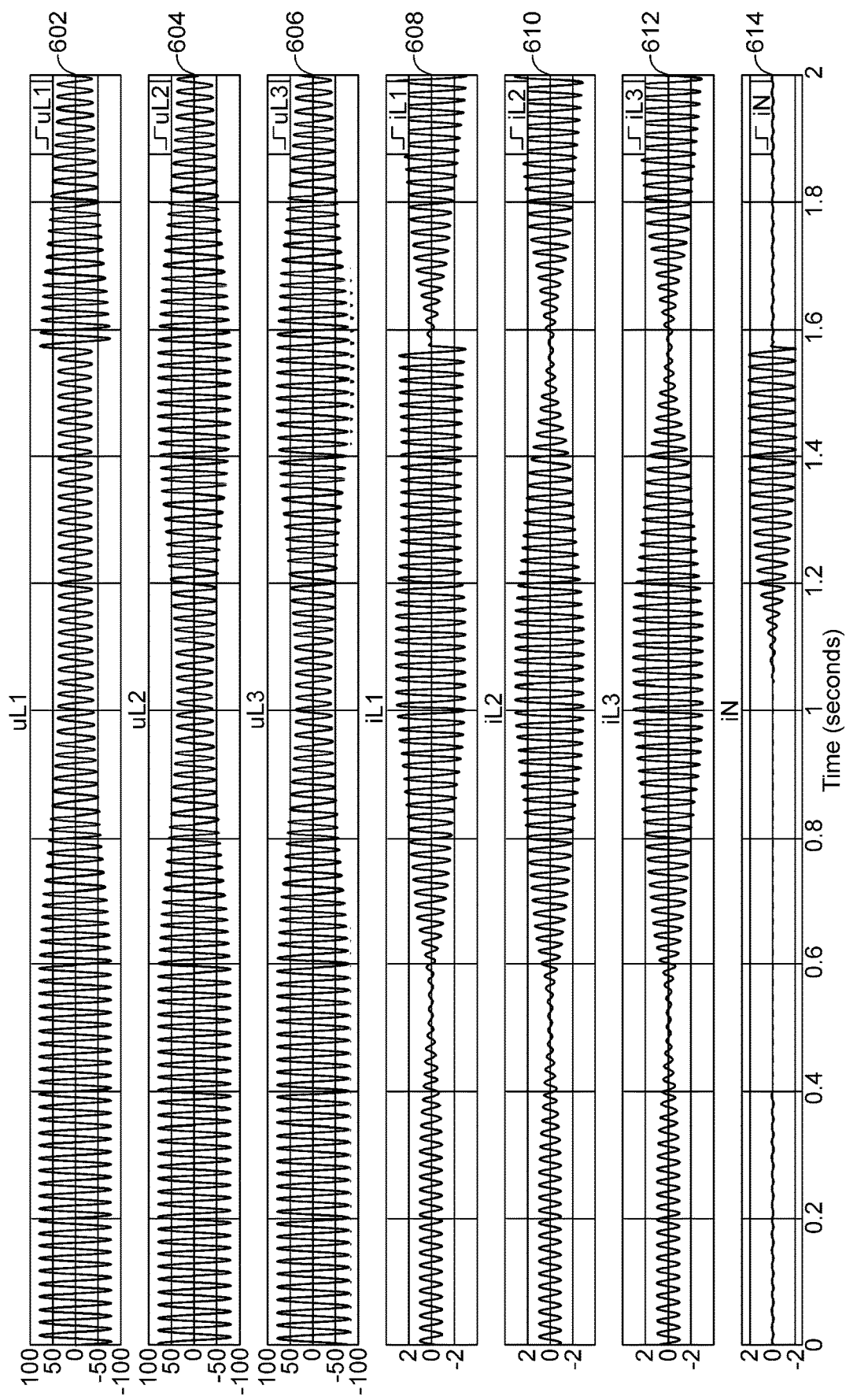
FIGS. 6(a), 6(b) and 6(c) illustrate fault detection, in accordance with an example implementation of the present subject matter.
Figure 6B:
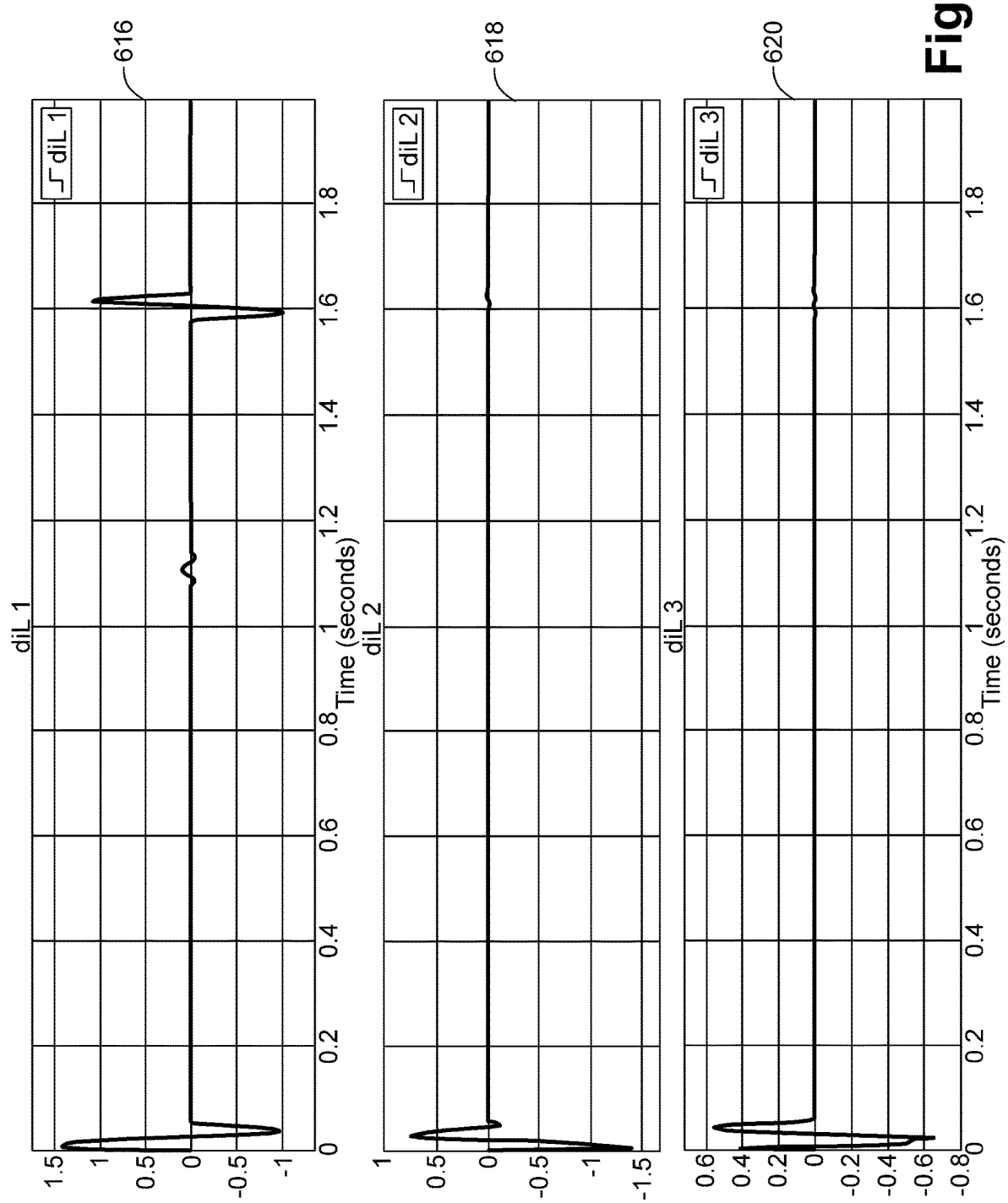
Figure 6C:
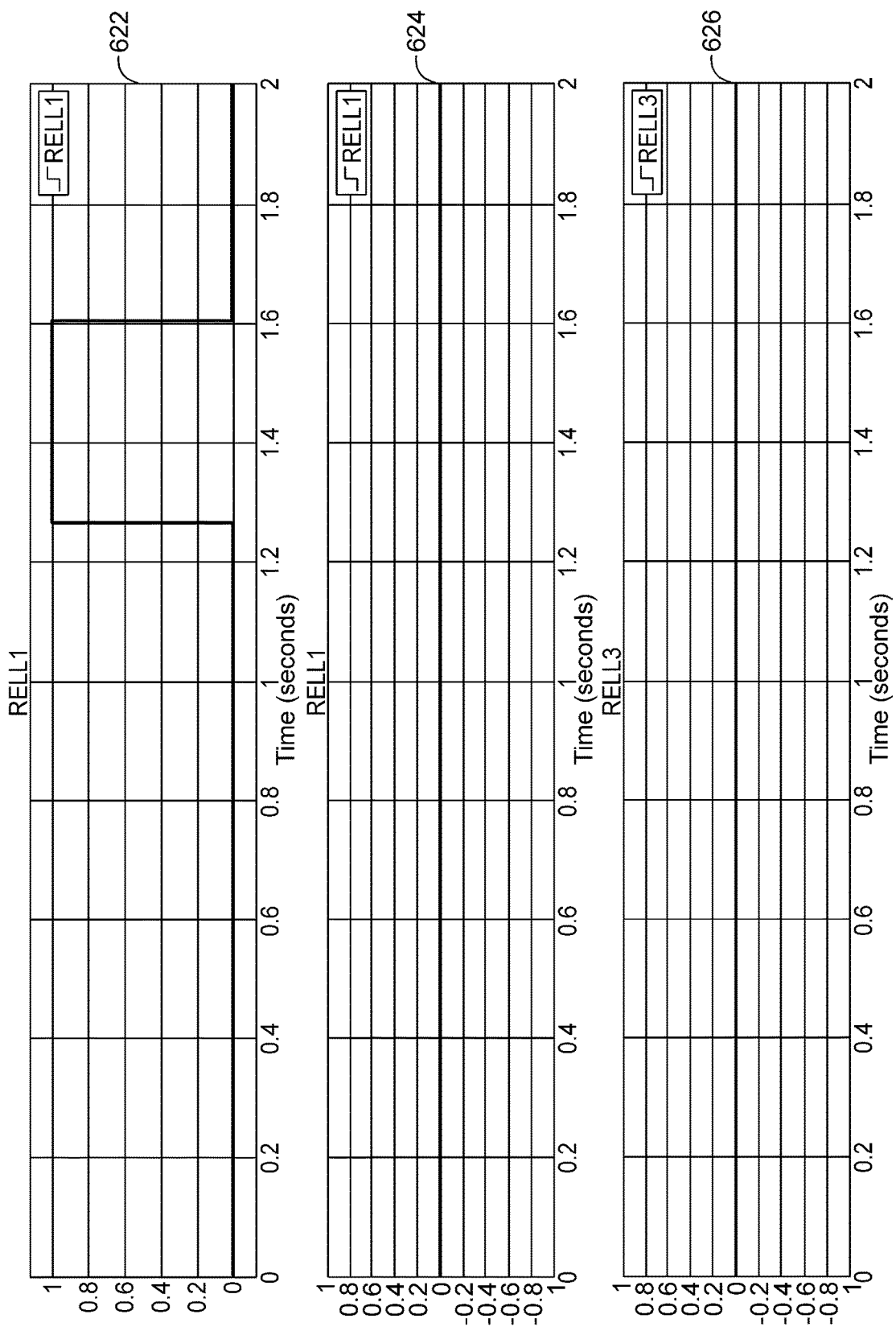

FIGS. 6(a), 6(b) and 6(c) illustrate fault detection, in accordance with an example implementation of the present subject matter.

The technique of fault detection and classification based on value of change in the impedance angle was tested for a 500 kV single circuit system 300 as shown in FIG. 3. The three-phase voltage and the three phase voltage currents measured at terminals M and N were fed to the IED 308 at terminal M and IED 310 at terminal N. Different fault scenarios for different type of faults, different values of fault resistance, source to line impedance ratios, fault locations, slip frequencies, and fault positions on swing period were created and tested.

A first scenario was tested and compared for two techniques used for fault detection. The first technique for fault detection was based on the presence of delta currents, a method known in the art. The second technique for fault detection was based on the value of change in the impedance angle according to the present subject matter. The following parameters were used for simulating fault detection for the first technique and the second technique, a phase-to-ground fault on phase A, with a fault distance of 50 km on Line 1 and a fault inception time of 1.08 s was simulated and tested.

FIG. 6(a) depicts the three-phase voltage signals 602, 604 and 606 of phase A, B, and C and current signals 608, 610, 612, and 614 of phase A, B, C, and neutral respectively measured at TED A of terminal M. FIG. 6(b) depicts three-phase current signals 616, 618 and 620 at fault inception. The graph shows the results obtained from the first technique for fault detection and it was observed that low delta currents below the current threshold have been detected for three phase currents at the fault inception. Accordingly, the phase-to-ground fault on phase A was not detected. Whereas, FIG. 6(c) depicts the release signal 622, 624 and 626 for distance measuring in phase A, B and C respectively on fault detection by change in impedance angle method of the present subject matter. The output obtained by the change in the impedance angle technique according to the present subject matter, results in a release signal 622 for the distance to be measured at 1.235 s on detecting the phase-to-ground fault in phase A.

Figure 7A:
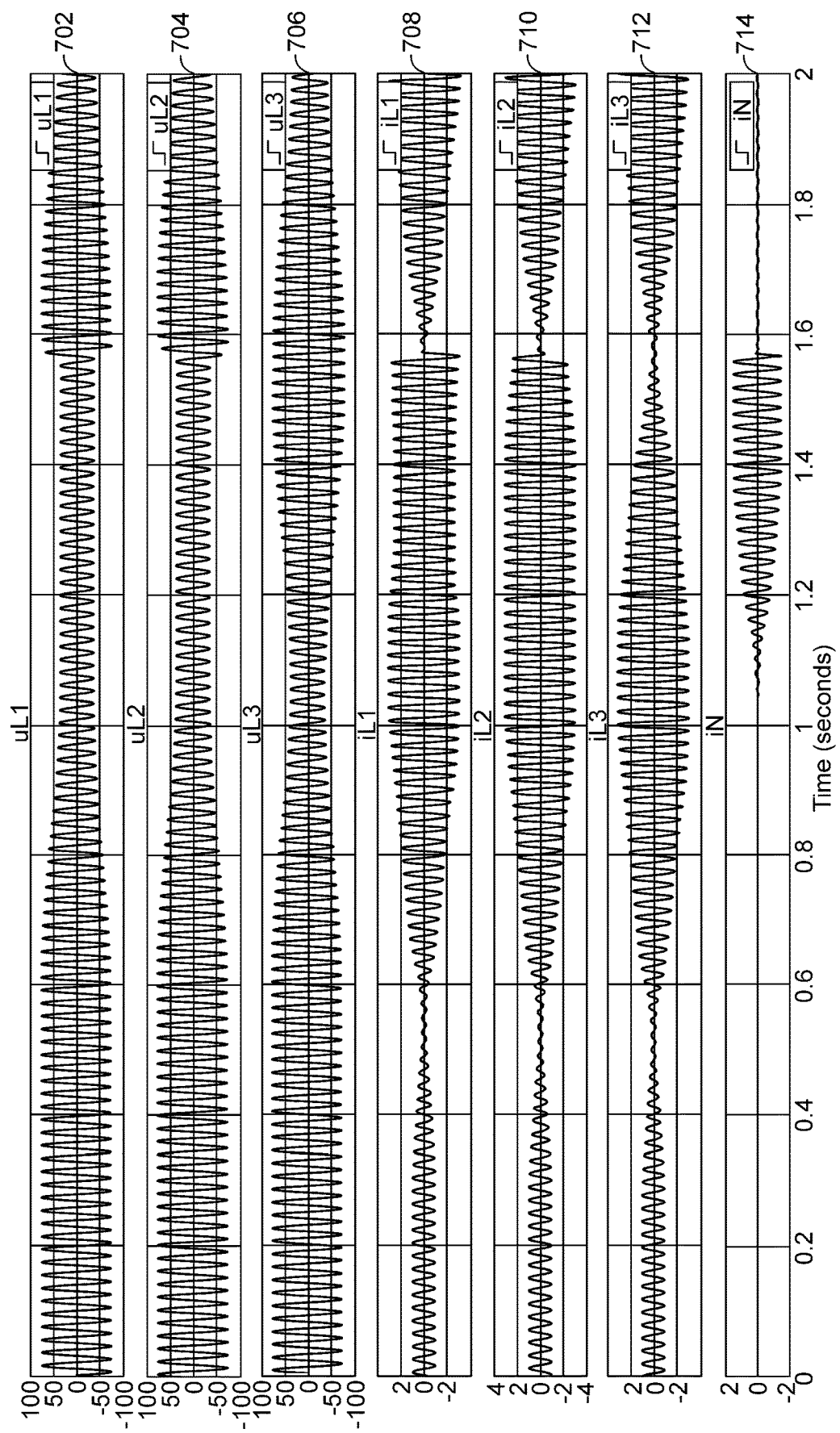
FIGS. 7(a), 7(b) and 7(c) illustrate fault detection, in accordance with another example implementation of the present subject matter.
Figure 7B:
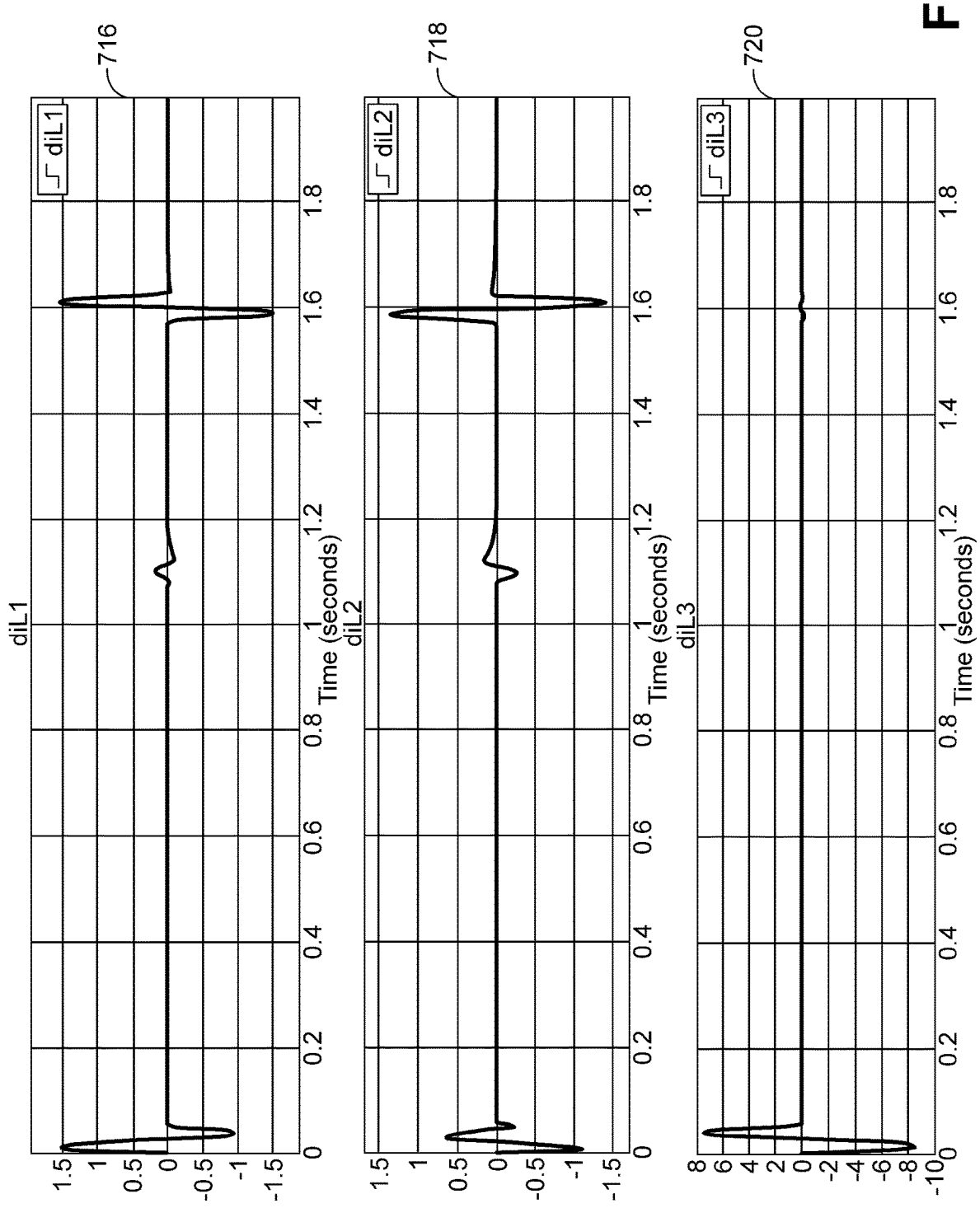
Figure 7C:
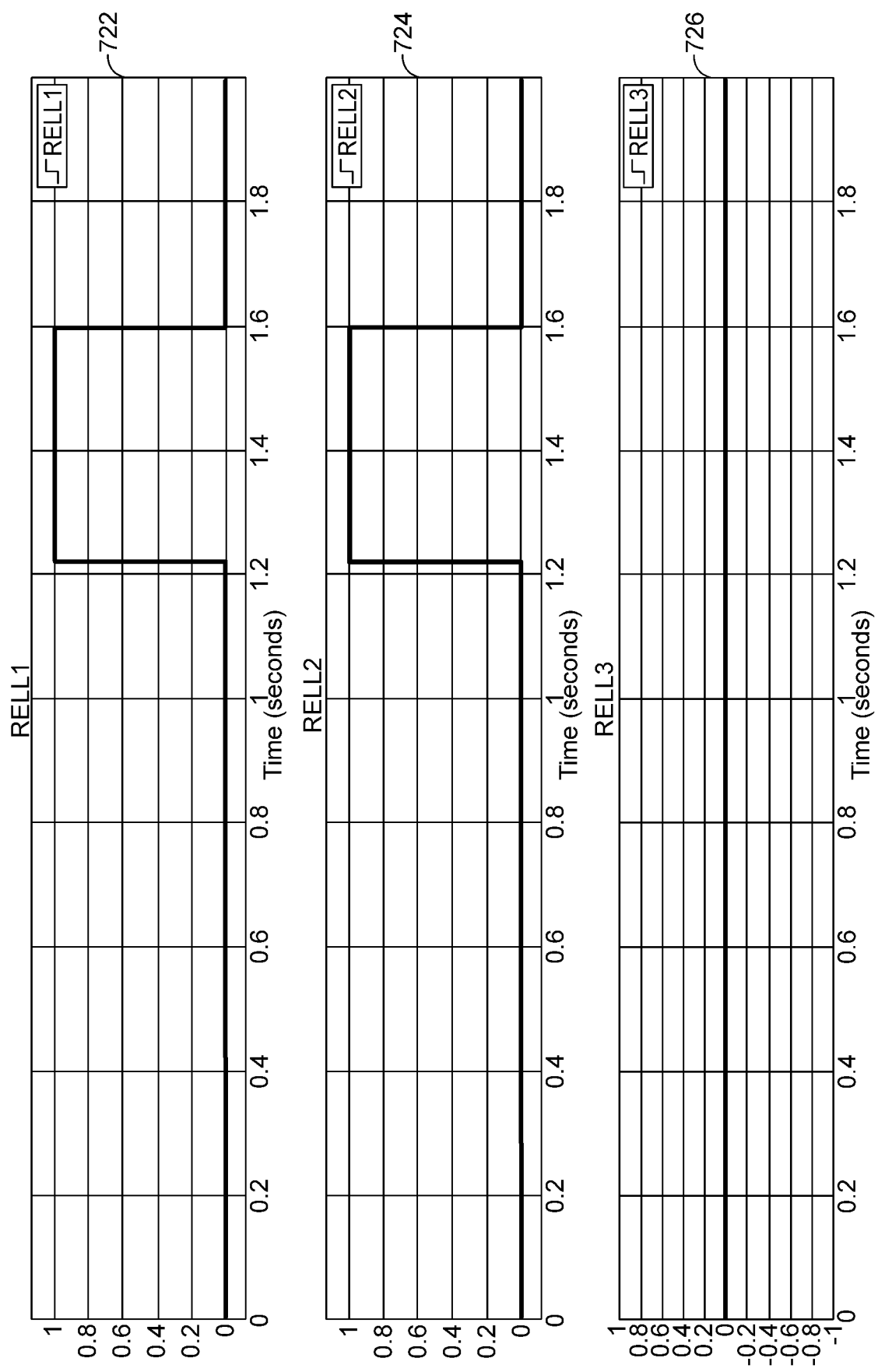

FIGS. 7(a), 7(b) and 7(c) illustrate fault detection, in accordance with another example implementation of the present subject matter.

A second scenario was tested and compared for two techniques for fault detection. The first technique for fault detection was based on the presence of delta currents, a method known in the art. The second technique for fault detection was based on the value of change in the impedance angle according to the present subject matter. The following parameters were used for simulating fault detection for the first technique and the second technique, a phase-to-phase-ground fault on phases AB, with a fault distance of 50 km on Line 1 and a fault inception time of 1.08 s was simulated and tested.

FIG. 7(a) depicts the three-phase voltage signals 702, 704 and 706 of phase A, B, and C and current signals 708, 710, 712, and 714 of phase A, B, C, and neutral respectively measured at TED A of terminal M. FIG. 7(b) depicts three-phase current signals 716, 718 and 720 at fault inception. The graph shows the results obtained from the first technique for fault detection and it was observed that low delta currents that have been measured for the faulty phases. As there are no delta currents over the threshold that have been observed during fault inception in the graph as depicted in FIG. 7(*b*), the phase-to-phase-to-ground fault on phases AB was not detected. Whereas, FIG. 7(*c*) depicts the release signal 722, 724 and 726 for distance measuring in phase A, B and C respectively on fault detection by change in impedance angle method of the present subject matter. The output obtained by the change in the impedance angle technique according to the present subject matter, results in a release signal 722 and 724 for the distance to be measured at 1.235 s on detecting the phase-to-phase-to-ground fault in phase A and B.

The present subject matter thus provides an accurate single ended method to detect and classify faults based on the value of change in the impedance angle that occur during a power swing. The method also detects and classifies faults that occur at the swing center voltages when there are minimal, or no changes observed in the delta currents. The method also provides reliable phase selection by using the average value of change in the impedance angles as discussed with respect to FIG. 4. The reliable phase selection ensures releasing the corresponding loops for distance protection which was blocked during power swing. On identifying the faulty loops, the distance protection is performed by distance protection relay or the IED to act against the fault situations in the power swing. Thus, fault detection and classification can be reliably performed during power swing using the methods and devices of the present subject matter.

The invention claimed is:

1. A method for fault detection during power swing in a power transmission system, the method comprising:
   obtaining voltage measurements and current measurements for each phase at a terminal of the power transmission system, wherein the voltage measurements and the current measurements are obtained with one or more measurement equipment associated with the terminal of the power transmission system, wherein the voltage measurements and the current measurements comprise sampled values of voltage and current obtained at the terminal;
   calculating, for each sampled value of the voltage and current, a value of change in an impedance angle for each phase-to-ground loop and each phase-to-phase loop, wherein the value of change in the impedance angle is a difference between impedance angles of two samples separated by a predetermined interval;
   calculating average values for change in impedance angle for a predetermined number of values of the change in the impedance angle, for each phase-to-ground loop and each phase-to-phase loop;
   comparing the average values calculated for each phase-to-ground loop and each phase-to-phase loop with a threshold range of change in impedance angle; and
   detecting a fault in one or more of the phase-to-ground loops or phase-to-phase loops when the average value calculated for the one or more phase-to-ground loops or phase-to-phase loops is within the threshold range.

2. The method as claimed in claim 1, wherein the method comprises releasing the corresponding loop for distance protection on detecting the fault in one or more of the phase-to-ground loops or phase-to-phase loops.

3. The method as claimed in claim 1, wherein the predetermined interval is a duration of one measurement cycle, wherein one measurement cycle comprises a predetermined number of samples based on a sampling frequency.

4. The method as claimed in claim 1, wherein the calculating the average values comprises applying a moving window average filter to calculate values of the change in impedance angle for the samples, wherein the predetermined number of values of the change in impedance angle is a size of the moving window.

5. The method as claimed in claim 4, wherein the size of the moving window is equal to a number of samples in one measurement cycle.

6. The method as claimed in claim 1, comprising detecting the fault in one or more of the phase-to-ground loops or phase-to-phase loops at a swing center voltage.

7. The method as claimed in claim 1, wherein the threshold range is 1 to 3 degrees.

8. The method as claimed in claim 1, comprising classifying the fault detected as a phase-to-ground fault, a phase-to-phase fault, or a double phase-to-ground fault based on a loop in which the fault is detected.

9. The method as claimed in claim 1, wherein the method comprises calculating voltage phasors and current phasors for each phase-to-ground loop and each phase-to-phase loop respectively based on a full cycle Discrete Fourier Transform of the voltage measurements and the current measurements.

10. An intelligent electronic device (IED) to detect a fault during a power swing in a power transmission line, the IED comprising:
    a processor; and
    a fault detection module executable by the processor to:
       obtain voltage measurements and current measurements from each phase at a terminal of the power transmission system, wherein the voltage measurements and the current measurements are obtained with one or more measurement equipment associated with the terminal of the power transmission system, wherein the voltage measurements and the current measurements comprise samples of voltage and current values obtained at the terminal;
       calculate, for each sample of the voltage and current values, a value of change in an impedance angle for each phase-to-ground loop and each phase-to-phase loop, wherein the value of change in the impedance angle is a difference between impedance angles of two samples separated by a predetermined interval;
       calculate average values for change in impedance angle for a predetermined number of values of the change in the impedance angles, for each phase-to-ground loop and each phase-to-phase loop;
       compare the average values calculated for each phase-to-ground loop and each phase-to-phase loop with a threshold range of change in impedance angle; and
       detect a fault in one or more of the phase-to-ground loops or phase-to-phase loops when the average value calculated for the one or more phase-to-ground loops or phase-to-phase loops is within the threshold range.

11. The device as claimed in claim 10, wherein the threshold range of change in impedance angle is $-\varepsilon$ to $+\varepsilon$, wherein $\varepsilon$ is in range of 1-3 degrees.

12. The device as claimed in claim 10, wherein the device is configured to release the corresponding loop for distance protection on detecting the fault in one or more of the phase-to-ground loops or phase-to-phase loops.

13. The device as claimed in claim 10, wherein the predetermined interval between the two samples for determining the value of change in impedance angle is a duration of one measurement cycle, wherein one measurement cycle comprises a predetermined number of samples based on a sampling frequency.

14. The device as claimed in claim 10, wherein, to calculate the average values, the fault detection module is configured to apply a moving window average filter to calculate values of the change in the impedance angle for the samples, wherein the predetermined number of values of the change in the impedance angle is a size of the moving window.

15. The device as claimed in claim 14, wherein the size of the moving window is equal to a number of samples in one measurement cycle.

16. The device as claimed in claim 10, wherein the fault detection module is configured to classify the fault detected as a phase-to-ground fault, a phase-to-phase fault, or a double phase-to-ground fault based on a loop in which the fault is detected.

17. A non-transient computer readable medium containing program instructions which when executed cause an intelligent electronic device (IED) to detect a fault during a power swing in a power transmission line, wherein the program instructions comprise instructions to:
   obtain voltage measurements and current measurements from each phase at a terminal of the power transmission system, wherein the voltage measurements and the current measurements are obtained with one or more measurement equipment associated with the terminal of the power transmission system, wherein the voltage measurements and the current measurements comprise samples of voltage and current values obtained at the terminal;
   calculate, for each sample of the voltage and current values, a value of change in an impedance angle for each phase-to-ground loop and each phase-to-phase loop, wherein the value of change in the impedance angle is a difference between impedance angles of two samples separated by a predetermined interval;
   calculate average values for change in impedance angle for a predetermined number of values of the change in the impedance angles, for each phase-to-ground loop and each phase-to-phase loop;
   compare the average values calculated for each phase-to-ground loop and each phase-to-phase loop with a threshold range of change in impedance angle, wherein the threshold range is $-\varepsilon$ to $+\varepsilon$, wherein $\varepsilon$ is in a range of 1-3 degrees; and
   detect a fault in one or more of the phase-to-ground loops or phase-to-phase loops when an average value of the change in impedance angle lies within the threshold range.

18. The non-transient computer readable medium as claimed in claim 17 wherein the program instructions comprise instructions to classify the fault detected as a phase-to-ground fault, a phase-to-phase fault, or a double phase-to-ground fault based on a loop in which the fault is detected.

* * * * *